(12) United States Patent
Atzesdorfer et al.

(10) Patent No.: US 6,365,269 B1
(45) Date of Patent: *Apr. 2, 2002

(54) PLASTIC COMPOSITIONS FOR SHEATHING A METAL OR SEMICONDUCTOR BODY

(75) Inventors: Alexandra Atzesdorfer, Weil am Rhein; Klaus Heckmann, Pettendorf; Josef Thumbs, Regensburg, all of (DE)

(73) Assignee: Infineon Technologies AG, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,371

(22) Filed: Nov. 20, 1998

(30) Foreign Application Priority Data

Nov. 20, 1997 (DE) .......................... 197 51 542

(51) Int. Cl.[7] .......................... B32B 15/04; B32B 15/08; B32B 27/18; B32B 27/20
(52) U.S. Cl. .......................... 428/331; 428/402; 428/403; 428/404; 428/457; 106/287.34; 106/481; 423/335
(58) Field of Search .......................... 428/323, 331, 428/402, 403, 404, 405, 457; 106/287.34, 481; 423/335

(56) References Cited

U.S. PATENT DOCUMENTS

| | | | |
|---|---|---|---|
| 3,503,128 A | | 3/1970 | Boyd et al. |
| 3,980,611 A | * | 9/1976 | Anderson et al. .......... 260/40 R |
| 4,764,497 A | * | 8/1988 | Yuasa et al. ................ 502/235 |
| 4,923,520 A | * | 5/1990 | Anzai et al. ................ 106/490 |
| 5,098,938 A | * | 3/1992 | Savin .......................... 523/220 |
| 5,102,836 A | | 4/1992 | Brown et al. |
| 5,188,881 A | | 2/1993 | Sugiyama et al. |
| 5,231,127 A | | 7/1993 | Kroenke et al. |
| 5,384,354 A | | 1/1995 | Hasegawa et al. |
| 5,478,632 A | * | 12/1995 | Kurz et al. .................. 428/212 |
| 5,885,689 A | * | 3/1999 | Hasegawa et al. .......... 428/141 |

FOREIGN PATENT DOCUMENTS

| | | |
|---|---|---|
| DE | 42 19 287 A1 | 12/1993 |
| DE | 44 22 118 A1 | 1/1996 |
| EP | 0 216 278 A2 | 4/1987 |
| EP | 0 361 109 A1 | 4/1990 |
| EP | 0 553 492 A2 | 8/1993 |
| EP | 1 024 175 A1 | 8/2000 |
| JP | 59 168 043 A | 9/1984 |
| JP | 60 115 641 A | 6/1985 |
| JP | 62 096 313 A | 5/1987 |
| JP | 63 317 540 A | 12/1988 |
| JP | 01 086 539 A2 | 3/1989 |
| JP | 01 240 556 A2 | 9/1989 |
| JP | 01 266 152 A2 | 10/1989 |
| JP | 02 145 642 A | 6/1990 |
| JP | 02 158 637 A | 6/1990 |
| JP | 02 178 347 A2 | 7/1990 |
| JP | 03 121 109 A | 5/1991 |
| JP | 03 177 450 A | 8/1991 |
| JP | 04 015 262 A2 | 1/1992 |
| JP | 04 233 750 A2 | 8/1992 |
| JP | 05 021 651 A | 1/1993 |
| JP | 05 206 333 A2 | 8/1993 |
| JP | 05 320 408 A | 12/1993 |
| JP | 06 200 125 A2 | 7/1994 |
| JP | 07 041544 A | 2/1995 |
| JP | 08 003 365 A | 1/1996 |
| RU | 899 600 | 1/1982 |
| WO | WO 98/21272 | 5/1998 |

OTHER PUBLICATIONS

Japanese Patent Abstract JP 6 3235–342–A, dated Sep. 30, 1988.
Japanese Patent Abstract JP 0 1011–162–A, dated Jan. 13, 1989.
Japanese Patent Abstract JP 0 1216–823–A, dated Aug. 30, 1989.
Japanese Patent Abstract JP 6 3312–345–A, dated Dec. 20, 1988.
Japanese Patent Abstract JP 5 7083–553, dated May 25, 1982.
Japanese Patent Abstract JP 06041347–A, dated Feb. 15, 1994.
E. Norbeck, Jr.: "New Nuclear Reactions induced by 2–m.e.v. Lithium ions: the Masses of Boron–13 and Carbon–15", Phys. Rev. (1957), No. 105, pp. 204–209.
Anonymous: "Transparent Polyester Substrate for Photosensitive Films on which is applied Photosensitive Layer which contains Bimodal Distribution of Inorganic Particles consisting of Fine and Coarse Fractions", Derwent Abstract RD 388Q58 A, dated Aug. 10, 1996.

\* cited by examiner

Primary Examiner—Vivian Chen
(74) Attorney, Agent, or Firm—Herbert L. Lerner; Laurence A. Greenberg; Werner H. Stemer

(57) ABSTRACT

The adhesion of plastic to metal surfaces is improved by adding a specific filler in the sheathing material. The filler is formed of spherical $SiO_2$ particles with a graduated diameter distribution defining individual diameter stages wherein the standard deviation in mean particle diameter of at least one diameter stage of said $SiO_2$ particles is less than 10%. Spherical $SiO_2$ particles with a graduated diameter distribution defining individual diameter stages are also mixed together in such ratio to obtain packing densities of 90% or more. Said spherical $SiO_2$ particles with a graduated diameter distribution defining individual diameter stages may also be characterized as having an index of refraction which increases from the center of a particle to the surface.

21 Claims, No Drawings

PLASTIC COMPOSITIONS FOR SHEATHING A METAL OR SEMICONDUCTOR BODY

BACKGROUND OF THE INVENTION

Field of the Invention

The invention relates to plastic compositions for sheathing a metal body and/or a semiconductor body. The plastics have at least one polymer, in particular a duroplast (thermosetting plastic), and at least one filler. The invention also relates to method for producing fillers and to the fillers themselves. Finally, the invention also relates to plastic composite bodies, which have a base body comprising a metal and/or semiconductor material and have a sheath that has at least one filler and a polymer. Finally, the invention also pertains to a method for detecting the presence of a filler according to the invention in a plastic composite body.

In plastic composite bodies, such as semiconductor components, which have a base body of metal, such as a lead frame, and bodies of semiconductor material, such as a microchip, undesirable failures often occur under actual environmental conditions. In the prior art, this is ascribed above all to a different coefficient of thermal expansion for the material of a sheath of the base body and for the base body itself.

To compensate for differences in the coefficient of thermal expansion of the sheath and of the base body, the prior art often admixed quartz glass with the basic material of the sheath. It is problematic that with the polymers used to fabricate the sheath, adding quartz glass still cannot attain an adequate reduction in the coefficient of thermal expansion of the sheath. If the proportions of quartz glass in the sheath material are too high, problems also occur in molding the sheath.

In the prior art, a different course is therefore fundamentally recommended, namely the development of sheathing materials that adhere better to the base body. Here it is problematic that the polymers developed for this purpose are very expensive and can therefore not be considered for use on a mass production scale.

SUMMARY OF THE INVENTION

It is accordingly an object of the invention to provide suitable plastic compositions, fillers, methods for producing suitable fillers, and plastic composite bodies, which overcome the above-mentioned disadvantages of the heretofore-known devices and methods of this general type and which assure reliable operation of the plastic composite bodies, even under changing environmental conditions.

With the foregoing and other objects in view there is provided, in accordance with the invention, a plastic composition for sheathing a metal and/or semiconductor body, comprising:

- at least one polymer, in particular a duroplast, and at least one filler;
- the filler having spherical $SiO_2$ particles with a graduated diameter distribution defining individual diameter stages, and wherein a standard deviation in a mean diameter of the $SiO_2$ particles of at least one diameter stage is less than 10%.

In accordance with an added feature of the invention, the standard deviation in the mean diameter of the $SiO_2$ particles of at least one diameter stage is less than 5%, and preferably even less than 1.7%.

In other words, it is a first aspect of the invention to provide a filler for the polymer forming the sheath, where spherical $SiO_2$ particles with a graduated diameter distribution are used, and the standard deviation in the mean diameter of the $SiO_2$ particles of at least one diameter stage is less than 10%. Depending on the quality of the production process of the spherical $SiO_2$ particles, standard deviations of the mean diameter of less than 5% and less than 1.7% can also be attained.

In accordance with an additional feature of the invention, a quantity of $SiO_2$ particles of at least one diameter stage and the mean diameters of the individual diameter stages are selected such that a packing density of the $SiO_2$ particles of at least 90% results. A packing density of better than 95% can be achieved by proper selection of these parameters. This results in a plastic composition which has the requisite rheological properties from rolled processing with a low proportion of polymer. The spherical fillers may be provided in bimodal or trimodal particle size distributions. For such a filler, beginning with the most precisely possibly specified primary particle diameter, smaller particles are admixed, whose diameters fit precisely into the interstices thus created in the packing of the primary particles. For a primary particle diameter of $d=40\,\mu m$, interstices are created that are optimally filled up approximately with secondary beads or balls 9 $\mu m$ in diameter. The residual voids that then still remain can be filled with a further fraction of correspondingly smaller particles. By using $SiO_2$ particles with a low standard deviation of the mean diameter within a diameter stage, it becomes especially easy to classify the corresponding particles in the smaller diameter stages. It is advantageous that the improvements in the properties of the plastic composition result regardless of which material makes up the primary component of the polymer.

With the above and other objects in view there is also provided, in accordance with an alternative feature of the invention, a plastic composition for sheathing a metal and/or semiconductor body, comprising:

- at least one polymer (e.g. duroplast) and at least one filler;
- the filler comprising spherical $SiO_2$ particles each having an interior with a center and a surface, and wherein an index of refraction in the interior of at least one of the $SiO_2$ particles increases from the center to the surface.

The same advantages as noted above are obtained in the use of spherical $SiO_2$ particles as a filler in which the index of refraction in the interior of at least one $SiO_2$ particle increases in a direction from its center to its surface. It has been found that when $SiO_2$ particles that have this characteristic are used, plastic compositions that can be processed especially well can also be produced.

The course of the index of refraction or the optical coefficient of refraction in the interior of a spherical $SiO_2$ particle of a sheathing material according to the invention is measured using contrast variation in a suspension of the spherical $SiO_2$ particles. Precisely in spherical $SiO_2$ particles with diameters up to about 100 nm, the courses according to the invention of the optical index of refraction can be readily determined. The method for measuring the index of refraction is based on the fact that the optical contrast of a suspended particle depends on the quantitative difference between the index of refraction of the particle and the index of refraction of the dispersing agent. If the indices of refraction of the particle and of the dispersing agent have the same value, then the contrast equals zero and thus the particle is optically imperceptible. It is possible to vary the optical contrast to suspended particles if the index of refraction of the dispersing agent can be varied continuously by the addition of a miscible second substance. If the dispersing agent is formed by hexane, then benzene can for instance be added as a second substance. If the index of refraction of the particles differs from the index of refraction of the peripheries of the particles, then the contrast of the "shells" of the particles can be reduced to zero by the choice of a suitable index of refraction of the dispersing agent. Then only a nucleus of the particles remains optically observable. In particles with a nonhomogeneous course of the index of refraction, a variation in the optically observable particle size can be attained. By varying the proportions of dispersing agent and second substance, the course of the index of refraction can thus be measured in the interior of the spherical $SiO_2$ particles. For the measurement, a particle size determination is done using a scattered light method, while the index of refraction of the dispersing agent is being varied. From the association between the index of refraction of the dispersing agent and the measured particle diameter, the radius-dependent course of the index of refraction inside the particles can be ascertained.

In accordance with another feature of the invention, the surface of the $SiO_2$ particles has an at least partial modification with trialkoxysilanes. The trialkoxysilanes are advantageously selected from the group consisting of methyltriethoxysilane, ethyltriethoxysilane, hexyltriethoxysilane, 3-aminopropyltriethoxysilane, 3-glycidoxypropyltrieth-oxysilane, and 3-mercaptopropyltriethoxysilane.

There is also provided a method of producing spherical $SiO_2$ particles, which comprises the following steps:
  polymerizing silicic acid in one or more steps with hydrolyzation of tetraalkoxysilanes and forming spherical $SiO_2$ particles;
  subjecting a surface of the $SiO_2$ particles at least partially to a modification with trialkoxysilanes, such as methyltriethoxysilane, ethyltriethoxysilane, hexyltriethoxysilane, 3-aminopropyltriethoxysilane, 3-glycidoxy-propyltriethoxysilane, or 3-mercaptopropyltriethoxysilane.

In other words, the method for producing the spherical $SiO_2$ particles used according to the invention includes a step of polymerization of silicic acid from the hydrolysis, in particular the alkaline hydrolysis, of tetraethoxysilane (TES). Here, an alkaline hydrolysis of TES is preferably effected in an alcohol or ethanol solution. Aqueously dissolved ammonia as a catalyst is also contemplated, and in a particular course of the method, spherical $SiO_2$ particles are created in accordance with the following reaction equation:

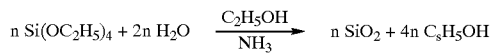

The silicic acid can be polymerized by adding TES a single time, or by an essentially continuous addition of TES. In the first case beads with diameters in the nanometer range result, while in the second case beads with a larger diameter are created, and a sharply defined size distribution is attained. The step of continuous addition of TES is preferably effected such that the concentration of free TES in a reaction vessel is always below an experimentally determinable nucleation concentration. Advantageously, the step of polymerization of silicic acid is performed at a temperature that is reduced relative to room temperature and may be less than 0° C. or less than −20° C.

$SiO_2$ particles produced in this kind of sol-gel process have especially strongly activated surfaces, which increase the reactivity with such sheathing materials as polymers considerably. A complete surface coverage with polymers can thus be attained. Because of the reduction in the reaction temperature, the diameter of the resultant silica beads or balls can be increased without increasing their standard deviation in terms of the mean diameter. At a reduced temperature, the tendency to newly form undesired nuclei out of solution in fact no longer exists to the same extent as at room temperature. Thus more TES is available for the further growth of already existing beads. Precisely when the reaction temperature is reduced to −20° C., markedly enlarged final particle sizes are thus obtained, and in a good approximation monodisperse bead diameters of 1.7 $\mu$m can be attained.

If the addition of the silicate is done continuously over a period of several hours with constant agitation, then the initially formed nuclei of $SiO_2$ grow into beads with diameters in the micrometer range, with a sharply defined size distribution. For optimal growth of the beads, the concentration of free TES in the reaction vessel must always be below a critical nucleation concentration. This can be attained if the inflow of TES is always below or equal to the reaction-dictated rate of degradation of TES. For the controlled addition of defined quantities of TES over an arbitrarily selectable period of time, a metering device with computer-controlled timing is for instance suitable.

For production on a laboratory scale of the $SiO_2$ beads used according to the invention, a mixture of 50 ml of ethanol and 10 ml of ammonia solution is prepared and brought in the cryostat to a temperature of −200° C. With constant agitation, a total of 2 ml of TES are added over a period of 10 hours. once the addition is concluded, the solution continues to be stirred for a further two hours. At the end of the procedure, a suspension of spherical particles approximately 1 $\mu$m in diameter is available.

Spheres of $SiO_2$ produced in this way can be used as starting particles or seeds for further increasing the bead diameter. To that end, 5 ml of the previously prepared $SiO_2$ suspension are added to a mixture of 50 ml of ethanol and 10 ml of ammonia solution. Analogously to the previous step, a further 2 ml of TES are added to the reaction solution. At the end of this procedure, the monodisperse bead diameter is approximately 1.2 $\mu$m. Repetition of the described method steps allows a continual increase in the primary particle diameter. After the fourth repetition of the addition operation, the monodisperse bead diameter is approximately 1.7 $\mu$m.

In a concluding step, the $NH_3$ is expelled. To that end, with constant agitation, the solution is kept at a temperature of 50° C. for several hours, until pH neutrality is attained. Finally, the suspension is concentrated by centrifuging at moderate rpm to approximately ⅕ the original volume. In this form, the ethanolic particle suspension can be stored or is accessible to surface treatment, for instance by silanization.

Spherical $SiO_2$ particles can thus be produced that have properties that appear especially advantageous for use in plastic composite bodies and their molding compositions. In the methods used in the prior art for producing spherical quartz material in the plasma phase, the superficial silanol groups, in accordance with a discovery that is fundamental to the invention, are maximally hydrolyzed into siloxane groups at the prevailing high temperatures. It has been found that with this quartz material, a surface-covering binding of polymer primers is possible only with difficulty. By means of the invention, it has been found that this property is due to the fact that the siloxane groups are relatively nonpolar and comparatively sluggish to react, which severely impairs the chemical adhesion of adhesion promoters. The surfaces of the particles produced by the method of the invention, in contrast to the prior art, have a high density of reactive silanol groups, which enables a surface-covering adhesion of polymer primers.

In a further feature of the invention, the surface of the $SiO_2$ particles can be modified, for instance with trialkoxysilanes. The following substances are especially attractive for the modification:

methyltriethoxysilane, ethyltriethoxysilane, hexyltriethoxy-silane, 3-aminopropyltriethoxysilane, 3-glycidoxypropyl-triethoxysilane, 3-mercaptopropyltriethoxysilane.

The coating process proceeds analogously to current methods for conventional fillers. However, coating the $SiO_2$ beads described here leads to better results, since the $SiO_2$ involved has more-reactive surfaces.

According to the invention, both $SiO_2$ particles with sharply defined diameter stages and $SiO_2$ particles with nonsharply defined diameter stages can be mixed together to attain the effect according to the invention.

The invention further provides a plastic composite body, in particular an integrated circuit, comprising:

a base body of a metal and/or semiconductor material; and
a sheath of the base body, the sheath being formed of a polymer and at least one filler;
the filler having spherical $SiO_2$ particles with a graduated diameter distribution defining individual diameter stages, and a standard deviation in a mean diameter of the $SiO_2$ particles of at least one diameter stage being less than 10%.

In accordance with the invention, there is also provided a qualitative analysis method for a sheath of a plastic composite body, wherein the sheath is formed of a polymer and has at least one filler with spherical $SiO_2$ particles having a graduated diameter distribution with distinct diameter stages, wherein a standard deviation of the mean diameter of the $SiO_2$ particles of at least one diameter stage is less than a value to be determined. The method comprises the following steps:

separating $SiO_2$ particles out of the sheath of the plastic composite body, such as by melting the $SiO_2$ particles out of the sheath by heat treatment, or by dissolving the $SiO_2$ particles out of the sheath with sulfuric acid or acetone;
preparing a true-to-scale image of the $SiO_2$ particles, such as a micrograph prepared with an scanning electron microscope (SAM);
determining a diameter of the $SiO_2$ particles visible in the image;
assigning the visible $SiO_2$ particles to diameter stages corresponding to a mean diameter thereof; and
calculating a mean value and a standard deviation of the diameter of the $SiO_2$ particles for each diameter stage.

There is also provided, in accordance with the invention and in the context of a plastic composite body with a sheath formed of a polymer and at least one filler with spherical $SiO_2$ particles having a graduated diameter distribution, a method of determining an index of refraction within at least one $SiO_2$ particle. The method comprises the following steps:

separating $SiO_2$ particles out of the sheath of the plastic composite body; and measuring an index of refraction in an interior of at least one of the $SiO_2$ particles and in a direction from a center to a surface thereof.

In other words, the invention also encompasses methods for detecting whether a plastic composition according to the invention has been used to produce a plastic composite body according to the invention. The corresponding detection methods—here referred to as a qualitative analysis process—include either the steps of determining the mean diameter—and the mean value and standard deviation of the mean diameter, with the aid of the copy of the $SiO_2$ particles dissolved out of the sheath, or measuring the index of refraction in the interior of at least one $SiO_2$ particle. To determine the sphericity of the particles, it is also possible, instead of dissolving the $SiO_2$ particles out of the sheath, to prepare an appropriate fracture surface or polished section face.

The $SiO_2$ particles from the sol-gel process that are used according to the invention can be distinguished as follows, from their appearance in terms of their high monodispersity and sphericity, from conventional spherical quartz material fillings:

A particular characteristic of the $SiO_2$ particles ($SiO_2$ beads) produced by the sol-gel process is the particularly slight variation in particle size about its mean value. This is therefore also said to be a highly monodisperse system.

Another special feature is the high sphericity of these particles. Deviations from the ideal spherical form are expressed in a particle in the fact that the measured primary particle diameter has different values depending on the three-dimensional orientation inside the particle. One measure for the sphericity of a particle is the variation in the different diameter values that occur in one and the same particle. In the case of an ideal sphere, this variation has the value of zero.

These above-described characteristics are expressed clearly in a comparison of scanning electron micrographs. A series of micrographs of a typical example of conventional fillers of spherical quartz material in fact shows markedly greater variation in the particle size and substantially more frequent deviation from the spherical form according to the invention.

This identification process can be applied equally to both finished component coatings and to still unprocessed casting compositions.

First, by heating in the oven to approximately 700° C. for approximately one hour in an oxidizing atmosphere, such as room atmosphere, the organic ingredients in the casting composition are eliminated. The inorganic filler that remains after this procedure is dispersed in the form of a suspension, for instance in ethanol, by ultrasound. After a drying step, the filler can be examined using a scanning electron micrograph. The ascertainment of monodispersity and sphericity of the filler can be done by measuring a statistically relevant number of particles from the micrograph or with the aid of suitable image recognition software. For determining the sphericity, the maximum and minimum primary particle diameters $d_{max}$ and $d_{min}$ that occur are ascertained for individual particles, and the standard deviation $\sigma_i$, in percentage, of these two measured values from the averaged diameter of the particle $d_i (=d_{max}+d_{min})/2$ is calculated. If the $\sigma_1$, values obtained are averaged over a statistically relevant number of particles, then in the case of the $SiO_2$ beads, a value of less than 10% and in particular less than 5% is the result.

Information on the monodispersity of the $SiO_2$ beads is obtained from the standard deviation, in percent, of the individual $d_i$ values from their mean value D. In the case of the $SiO_2$ beads, this standard deviation is less than 10% and in particular less than 5%. If a filler is composed of a plurality of nonoverlapping particle size fractions, such as bimodal or trimodal particle size distributions, then the analysis of monodispersity should be done separately for each peak in the particle size distribution.

In the fillers known from the prior art, such sharply defined size distributions cannot be achieved, because these fillers always have a large proportion of irregularly shaped "gravel." The typical variation in terms of particle shapes and size for conventional fillers is already expressed in the fracture pattern or section face of a filled molding composition.

By comparison, fracture patterns or cut surfaces of the plastic compositions or sheaths according to the invention always appear as an arrangement of beads with equal diameters that result in a virtually perfect "billiard-ball" pattern, or the image of perfect spheres, which may also be located in a virtually perfect ball packing. In cut faces of filled compositions, balls of the same diameter are cut at different levels, leads to differently sized cut faces. The cut faces themselves intrinsically again have a circular diameter. The larger balls of $SiO_2$ may have a more-irregular particle size than the smaller balls. Precisely at a diameter of 1 $\mu$m, however, very "sharply defined" distributions result.

Another advantage in the production of plastic composite bodies is due to the fact that the fillers no longer have to be selected by fractionated screening processes; instead, their size can be defined directly upon synthesis. If the production process is carried out correctly, all the $SiO_2$ particles of one diameter stage has virtually the same diameter and can be used immediately.

With the filler particles according to the invention, the possibility is obtained of applying sufficiently high-quality adhesion promoters, since the filler surfaces have silanol groups that reinforce the chemical adhesion of primers, such as adhesion promoters, in the surface coating.

This filler is mixed with conventional duroplasts and/or thermoplastics and used to sheath a metal and semiconductor body.

With the objects of the invention in view there is also provided, in accordance with the invention, a plastic composition for sheathing a metal and/or semiconductor body, comprising at least one polymer and at least one filler having a negative coefficient of thermal expansion.

By the provision of fillers with a negative coefficient of thermal expansion, in conjunction with other fillers, virtually arbitrary coefficients of thermal expansion of sheaths made with the plastic composition can be attained.

In plastic composite bodies exposed to temperature fluctuations, the result is good durability. The term "negative coefficient of thermal expansion" should be understood, in terms of the fundamental concept of the invention, to mean that a filler that has a coefficient of thermal expansion that is slightly greater than zero can also be used, if it can thus be assured—unlike in the prior art—that upon heating of a plastic composite body produced with the filler, only slight shear stresses arise between the plastic sheath and the metal or semiconductor components.

In accordance with again an added feature of the invention, the at least one filler comprises a substance selected from the group consisting of ceramic and mineral substances selected from the group consisting of:
  $CaZr_4P_6O_{24}$;
  $Al_2TiO_5$, $ZrTiO_4$, $ZrO_2$;
  alkaline earth ceramics, for instance with the formula $MZr_4P_6O_{24}$, where M is an element selected from the group consisting of Mg, Ca, Sr, and Ba.
  $LiAlSiO_4$, eucryptite, petalite, spodumene; and tialite.

In accordance with another feature of the invention, the at least one filler is composed of a mixed system of the substances selected from the group consisting of $Al_2TiO_5$, $ZrTiO_4$, and $ZrO_2$.

In accordance with an alternative feature of the invention, the at least one filler is composed of a mixed system of the substances selected from the group consisting of $Li_2O$, $Al_2O_3$, and $SiO_2$.

In other words, at least one of the fillers with a negative coefficient of thermal expansion may have one of the following ceramic or mineral substances: $CaZr_4P_6O_{24}$, $Al_2TiO_5$, $ZrTiO_4$, $ZrO_2$, alkaline earth ceramics such as $MZr_4P_6O_{24}$ (where M may in particular be one of the following elements: Mg, Ca, Sr, Ba), $LiAlSiO_4$ (eucryptite, petalite, spodumene, or some other substance from the mixed system $Li_2O$—$Al_2O_3$—$SiO_2$ that has suitable temperature expansion properties), and/or tialite. At least one of the fillers may also have a different composition comprising the mixture system of the substances $Al_2TiO_5$, $ZrTiO_4$, $ZrO_2$, which in accordance with the fundamental concept of the invention has suitable temperature expansion properties. The compositions may also be present in melted and subsequently comminuted form.

A method of producing the filler for a plastic composition comprises: mixing $Li_2CO_3$, $Al_2O_3$ and $SiO_2$ with one another in a mass ratio $Li_2CO_3:Al_2O_3:SiO_2 = 0.2496:0.3444:0.4060$, and melting the mixture at a temperature of at least 1388° C., or at a temperature of at least 1410° C.

This process leads to the production of an especially highly suitable filler for a plastic composition. High-purity lithium carbonate with alum clay $A_{16}$ with a mean particle size of approximately 300 nm and $SiO_2$ in the form of gravel-like quartz product with a mean particle size of about 35 $\mu$m are mixed homogeneously with one another in the mass ratio $Li_2CO_3:Al_2O_3:SiO_2=0.2496:0.3444:0.4060$ and melted at a temperature of at least 1388° C. Other mixtures of starting materials are also possible that contain Li, Al, $SiO_2$ particles and O, for instance with $Li_2O$ instead of $Li_2CO_3$. The melting process may also be executed at a higher temperature, of at least 1410° C. Preferably, the step of cooling of the melted starting material to form a solidified composition is performed at a rate of approximately 1410° C. per hour. The buildup of the crystal lattice of h-eucryptite then takes place from the molten phase. Because of its good properties as a fluxing agent, $Li_2CO_3$ is used. At temperatures above the melting point at the level of 720° C., $Li_2CO_3$ breaks down into $Li_2O$ and $CO_2$, which escapes without further influence on the synthesis process. To obtain a clear melt of the starting substance, it must be assured that the alum clay is in a form with an adequately small particle size. This is due to the very high melting point of pure alum clay, which is 2045° C. If the particles of alum clay are too large, then the reduction in the melting point effected by the fluxing agent $Li_2CO_3$ is not effective enough, which is then expressed in a markedly increased melting temperature of the precursor stage.

Advantageously, the step of cooling the melted composition is performed on a substantially flat surface of Pt/Au alloy 95/05. Next, at least one step of comminuting the solidified composition and at least one step of screening out particles of a desired size can be provided.

For the method of the invention, spherical $SiO_2$ particles according to the invention can also advantageously be employed. In addition, the filler particles of the invention can be used together with spherical particles; especially advantageous ways of attaining the object of the invention can be attained by varying the size distribution and quantitative distribution of the particles.

The invention further provides for plastic composite body, such as an integrated circuit, comprising: a base body of a material selected from the group of metal and semiconductor material, and a sheath of the base body having at least one filler and a polymer (e.g. duroplast), the at least one filler having a negative coefficient of thermal expansion.

A plastic composite body of the invention may have, in addition to a polymer for the sheath, a filler according to the invention added to the polymer.

Accordingly, the subject of the invention is also the aforementioned fillers themselves along with their use for plastic compositions to produce plastic composite bodies.

The use of the fillers of the invention with a "negative" coefficient of thermal expansion makes it possible to produce especially advantageous plastic composite bodies. With a lower proportion of filler, a lower coefficient of expansion in the sheath of the plastic composite body can be achieved. The proportion of resin can be increased, and as a result the polymer component not bound to the filler surface, and thus the adhesion, tensile strength and elasticity of the sheath, can be increased. This also improves processability.

To produce the h-eucryptite according to the invention as a filler with a negative coefficient of thermal expansion, the starting substances are mixed in a stoichiometric ratio of $Li_2O:Al_2O_3:SiO_2=1:1:2$. This fits the composition of $LiAlSiO_4$ (eucryptite). By using lithium carbonate as a starting material instead of $Li_2O$, the proportions of mixture components in terms of mass become the following:

| | |
|---|---|
| $Li_2O$ | 24.96% |
| $Al_2O_3$ | 34.44% |
| $SiO_2$ | 40.60%. |

This mixture is mixed in a grinding cup of a ball mill with chemically pure water (approximately 40 ml per 100 g of dry mixture), so that a just barely flowable paste is created. The mixture is homogenized at a medium rotational speed of the ball mill and with an agitation time of one hour.

The homogenized mixture is painted into a petri dish or some other dish that is as flat as possible and dried in the drying cabinet for 15 hours at 110° C. After the drying, coarse comminution of the baked composition with a mortar is recommended. Comminuting the precursor stage is favorable to uniform melting of the substance in the ensuing oven process.

In the oven process, the synthesis of the substance takes place in a flat dish made of Pt/Au 05/05 alloy. Unlike pure platinum, this alloy has good separation behavior with regard to the solidified melt.

The melting dish should be approximately the shape of a watch crystal. A flat dish shape is important, because in the cooling phase at the end of the oven process enormously high mechanical stresses can arise between the resultant h-eucryptite and the melting vessel, since the eucryptite expands on cooling down, because of the negative thermal expansion. This can be so extensive that the vessel is destroyed. If a flat dish is used, the stresses that arise between the eucryptite and the dish are oriented substantially at a tangent to the vessel wall and can be dissipated by the sliding of the contents along the wall.

To avert a possible outflow of melt in the oven, the use of a clay saucer for the ensuing oven operation is recommended.

In the high-temperature oven, the substance is brought to a temperature of 1410° C. at a heating rate of 1410° C. per hour and is kept at this temperature for four hours. This causes complete melting of the precursor stage while $CO_2$ escapes. In the ensuing lowering of the temperature, at a cooling rate of 1410° C. per hour, the melt solidifies at 1388° C. into h-eucryptite. From 100 g of precursor material, approximately 85 g of h-eucryptite are obtained. The weight loss is due to the outgassing of $CO_2$.

For final monitoring, the purity of the crystal structure can be checked using X-ray diffractometry.

For processing as a filler, the cooled melt is first coarsely comminuted and then finely granulated with a ball mill and screened to the desired particle size. This process can also be repeated several times, because of the relatively great hardness of the substance.

This filler is mixed with conventional duroplasts and/or thermoplastics and used for sheathing a metal and semiconductor body.

We claim:

1. A plastic composition for sheathing a metal and/or semiconductor body, comprising:
   at least one polymer and at least one filler;
   said filler having spherical $SiO_2$ particles with a graduated diameter distribution defining individual diameter stages containing more than two diameter stages including a primary stage, and wherein a standard deviation in a mean diameter of said $SiO_2$ particles of at least the primary diameter stage is less than 10%.

2. The plastic composition according to claim 1, wherein the standard deviation in the mean diameter of the $SiO_2$ particles of at least the primary diameter stage is less than 5%.

3. The plastic composition according to claim 2, wherein the standard deviation in the mean diameter of the $SiO_2$ particles of at least the primary diameter stage is less than 1.7%.

4. A plastic composition for sheathing a metal and/or semiconductor body, comprising:
   at least one polymer and at least one filler;
   said filler having spherical $SiO_2$ particles with a graduated diameter distribution defining individual diameter stages, and wherein a quantity of $SiO_2$ particles of at least one diameter stage and the mean diameters of the individual diameter stages are selected such that a packing density of the $SiO_2$ particles of at least 90% results.

5. The plastic composition according to claim 4, wherein said quantity of $SiO_2$ particles of one diameter stage and the mean diameters of the individual diameter stages are selected such that a packing density of the $SiO_2$ particles of at least 95% results.

6. A plastic composite body, comprising:
   a base body of a material selected from the group consisting of metal and semiconductor material; and
   a sheath of said base body, said sheath being formed of a polymer and at least one filler;
   said filler having spherical $SiO_2$ particles with a graduated diameter distribution defining individual diameter stages containing more than two diameter stages including a primary stage, and wherein a standard deviation in a mean diameter of said $SiO_2$ particles of at least the primary diameter stage is less than 10%.

7. The plastic composite body according to claim 6, wherein the standard deviation in the mean diameter of the $SiO_2$ particles of at least the primary diameter stage is less than 5%.

8. The plastic composite body according to claim 6, wherein the standard deviation in the mean diameter of the $SiO_2$ particles of at least the primary diameter stage is less than 1.7%.

9. The plastic composite body according to claim 6, wherein said surface of said $SiO_2$ particles has an at least partial modification with trialkoxysilanes.

10. The plastic composite body according to claim 9, wherein said trialkoxysilanes are selected from the group consisting of methyltriethoxysilane, ethyltriethoxysilane, hexyltri-ethoxysilane, 3-aminopropyltriethoxysilane, 3-glycidoxypropyl-triethoxysilane, and 3-mercaptopropyltriethoxysilane.

11. A plastic composite body comprising:
  a base body of a material selected from the group consisting of metal and semiconductor material; and
  a sheath of said base body, said sheath being formed of a polymer and at least one filler;
  said filler having spherical $SiO_2$ particles with a graduated diameter distribution defining individual diameter stages, and a quantity of $SiO_2$ particles of at least one diameter stage and the mean diameters of the individual diameter stages are selected such that a packing density of the $SiO_2$ particles of at least 90% results.

12. The plastic composite body according to claim 11, wherein said quantity of $SiO_2$ particles of at least one diameter stage and the mean diameters of the individual diameter stages are selected such that a packing density of the $SiO_2$ particles of at least 95% results.

13. A plastic composite body comprising:
  a base body of a material selected from the group consisting of metal and semiconductor material; and
  a sheath of said base body, said sheath being formed of a polymer and at least one filler;
  said filler having spherical $SiO_2$ particles with a graduated diameter distribution defining individual diameter stages, and an interior with a center and a surface, and wherein an index of refraction in the interior of at least one of said $SiO_2$ particles increases from said center to said surface.

14. A filler material for a plastic composition, comprising: spherical $SiO_2$ particles with a graduated diameter distribution defining distinct diameter stages containing more than two diameter stages including a primary stage, wherein a standard deviation in a mean diameter of said spherical $SiO_2$ particles of at least the primary diameter stage is less than 10%.

15. The filler material according to claim 14, wherein the standard deviation in the mean diameter of the $SiO_2$ particles of the at least the primary diameter stage is less than 5%.

16. The filler material according to claim 14, wherein the standard deviation in the mean diameter of the $SiO_2$ particles of the at least the primary diameter stage is less than 1.7%.

17. The filler material according to claim 14, wherein said surface of said $SiO_2$ particles has an at least partial modification with trialkoxysilanes.

18. The filler material according to claim 17, wherein said trialkoxysilanes are selected from the group consisting of methyltriethoxysilane, ethyltriethoxysilane, hexyltriethoxysilane, 3-aminopropyltriethoxysilane, 3-glycidoxypropyltriethoxysilane, and 3-mercaptopropyltriethoxysilane.

19. The filler material for a plastic composition, comprising: spherical $SiO_2$ particles with a graduated diameter distribution defining distinct diameter stages wherein a quantity of $SiO_2$ particles of at least one diameter stage and the mean diameters of the individual diameter stages are selected such that a packing density of the $SiO_2$ particles of at least 90% results.

20. The filler material according to claim 19, wherein said quantity of $SiO_2$ particles of at least one diameter stage and the mean diameters of the individual diameter stages are selected such that a packing density of the $SiO_2$ particles of at least 95% results.

21. A filler material for a plastic composition, comprising: spherical $SiO_2$ particles with a graduated diameter distribution defining distinct diameter stages, said spherical $SiO_2$ particles each has an interior with a center and a surface, and wherein an index of refraction in the interior of at least one of said $SiO_2$ particles increases from said center to said surface.

\* \* \* \* \*